United States Patent
Oraw

(10) Patent No.: US 9,196,606 B2
(45) Date of Patent: Nov. 24, 2015

(54) BONDING TRANSISTOR WAFER TO LED WAFER TO FORM ACTIVE LED MODULES

(71) Applicant: Nthdegree Technologies Worldwide Inc., Tempe, AZ (US)

(72) Inventor: Bradley S. Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 44 days.

(21) Appl. No.: 14/207,047

(22) Filed: Mar. 12, 2014

(65) Prior Publication Data

US 2014/0191246 A1  Jul. 10, 2014

Related U.S. Application Data

(63) Continuation-in-part of application No. 13/737,672, filed on Jan. 9, 2013.

(60) Provisional application No. 61/789,106, filed on Mar. 15, 2013.

(51) Int. Cl.
| | |
|---|---|
| *H01L 29/15* | (2006.01) |
| *H01L 21/00* | (2006.01) |
| *H01L 25/16* | (2006.01) |
| *H01L 33/00* | (2010.01) |

(52) U.S. Cl.
CPC .......... *H01L 25/167* (2013.01); *H01L 33/0079* (2013.01); *H01L 2924/0002* (2013.01)

(58) Field of Classification Search
CPC ................... H01L 2924/00; H01L 2924/0002; H01L 25/167; H01L 33/0079
See application file for complete search history.

(56) References Cited

U.S. PATENT DOCUMENTS

| | | | |
|---|---|---|---|
| 5,504,368 A | * | 4/1996 | Sawada ............... H01L 27/0233 |
| | | | 257/554 |
| 7,476,893 B2 | | 1/2009 | Yang et al. |
| 7,944,035 B2 | | 5/2011 | Bol |

(Continued)

FOREIGN PATENT DOCUMENTS

| | | |
|---|---|---|
| EP | 2 182 547 A2 | 5/2010 |
| EP | 2 375 460 A1 | 10/2011 |

(Continued)

OTHER PUBLICATIONS

PCT/US2014/026200, "International Search Report and Written Opinion," dated Sep. 19, 2014, 8 pages.

(Continued)

*Primary Examiner* — Whitney T Moore
*Assistant Examiner* — Joseph Galvin, III
(74) *Attorney, Agent, or Firm* — Patent Law Group LLP; Brian D. Ogonowsky

(57) ABSTRACT

LED modules are disclosed having a control MOSFET, or other transistor, in series with an LED. In one embodiment, a MOSFET wafer, containing an array of vertical MOSFETS, is aligned and bonded to an LED wafer, containing a corresponding array of vertical LEDs, and singulated to form thousands of active 3-terminal LED modules with the same footprint as a single LED. Despite the different forward voltages of red, green, and blue LEDs, RGB modules may be connected in parallel and their control voltages staggered at 60 Hz or greater to generate a single perceived color, such as white. The RGB modules may be connected in a panel for general illumination or for a color display.

18 Claims, 8 Drawing Sheets

(56) References Cited

U.S. PATENT DOCUMENTS

| | | |
|---|---|---|
| 7,977,133 B2 | 7/2011 | Yoo |
| 2008/0169773 A1 | 7/2008 | Chiozzi |
| 2009/0186219 A1* | 7/2009 | Inaba .................. C09J 9/02 428/354 |
| 2009/0230383 A1* | 9/2009 | Meng ................ H01L 27/3288 257/40 |
| 2009/0230384 A1* | 9/2009 | Meng ................ H01L 27/3288 257/40 |
| 2010/0226399 A1* | 9/2010 | Nishinaka .......... H05B 33/0821 372/38.04 |
| 2011/0127581 A1* | 6/2011 | Bethoux ............... H01L 21/187 257/201 |

FOREIGN PATENT DOCUMENTS

| | | |
|---|---|---|
| TW | 200939550 A | 9/2009 |
| TW | 200950152 A | 12/2009 |

OTHER PUBLICATIONS

International Search Report and Written Opinion, 7 pages.

Oraw, "Active LED Module", Unpublished U.S. Appl. No. 13/737,672, filed Jan. 9, 2013.

Oraw, "Thinfilim Process for Bond Integrated Active LED", Unpublished U.S. Appl. No. 61/789,106, filed Mar. 15, 2013.

* cited by examiner

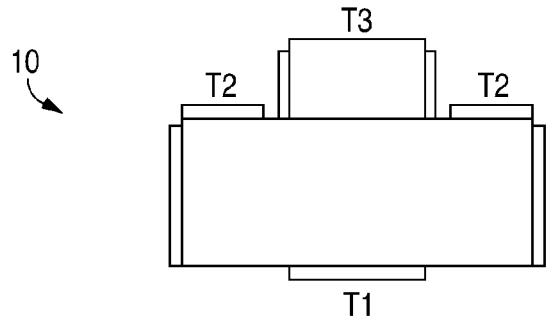
FIG. 3
| T1 | T2 | T3 |
|---|---|---|
| NEGATIVE | POSITIVE | CONTROL |
| NEGATIVE | CONTROL | POSITIVE |
| POSITIVE | NEGATIVE | CONTROL |
| POSITIVE | CONTROL | NEGATIVE |
| CONTROL | POSITIVE | NEGATIVE |
| CONTROL | NEGATIVE | POSITIVE |
FIG. 4
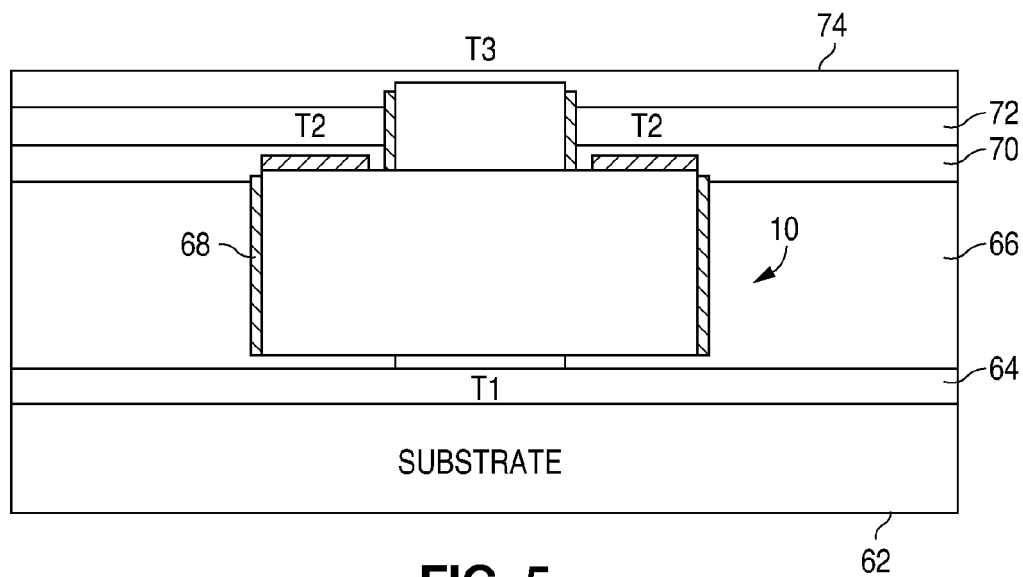
FIG. 5

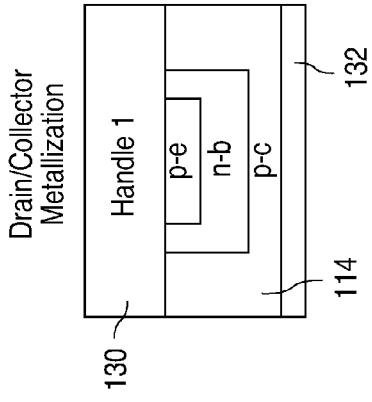
FIG. 24 Bond to Handle Wafer 1
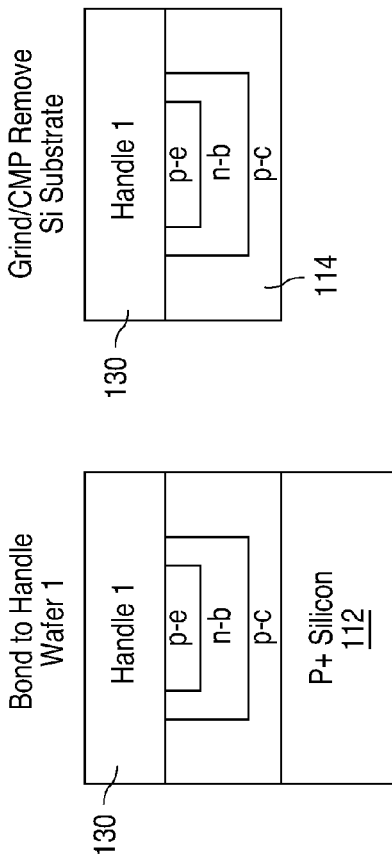
FIG. 25 Grind/CMP Remove Si Substrate
FIG. 26 Drain/Collector Metallization
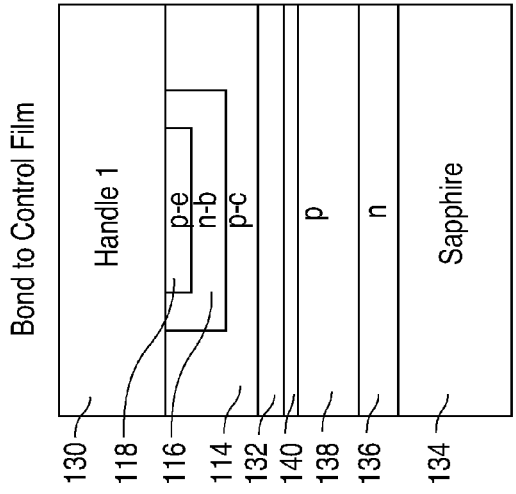
FIG. 29 Bond to Control Film
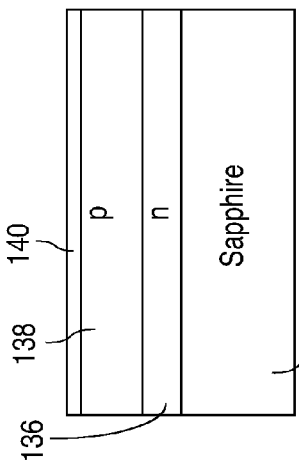
FIG. 28 Anode Metallization
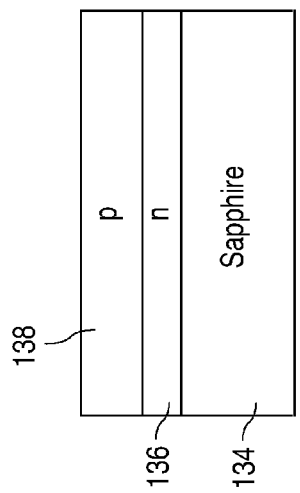
FIG. 27 Starting LED Epitaxy

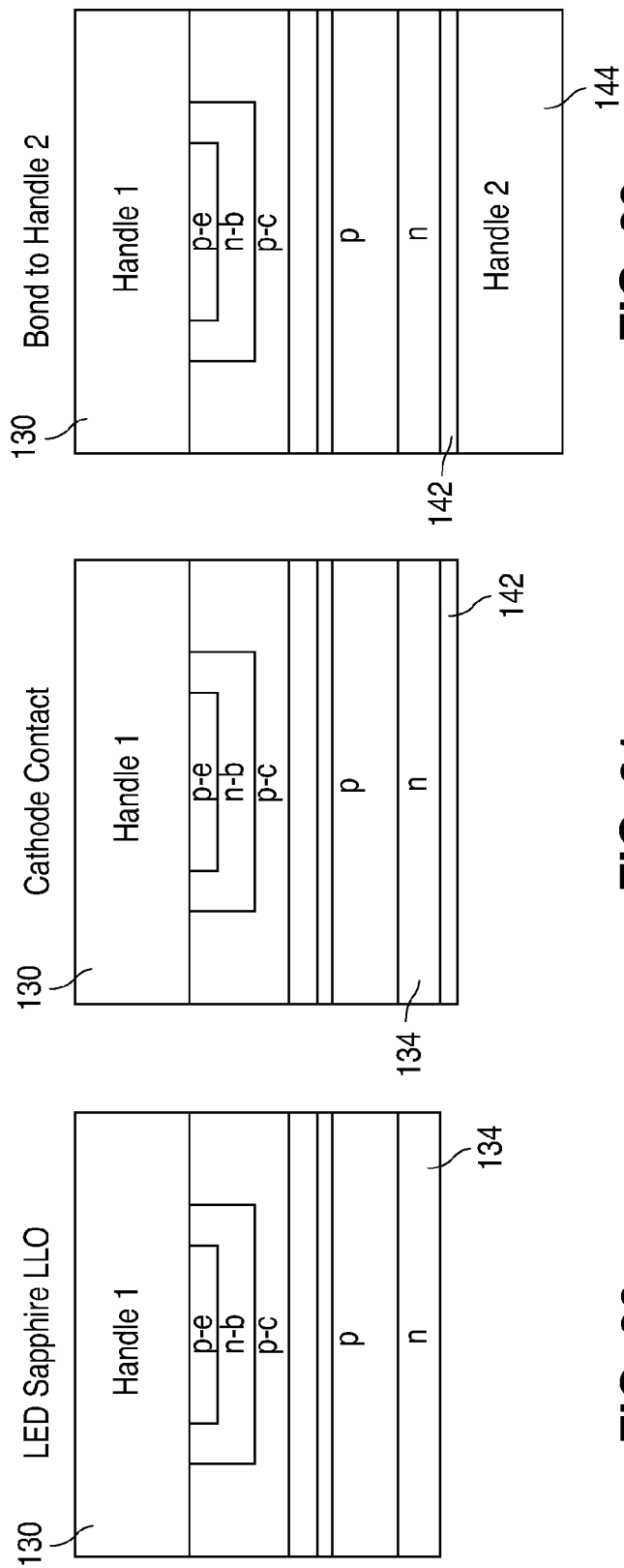

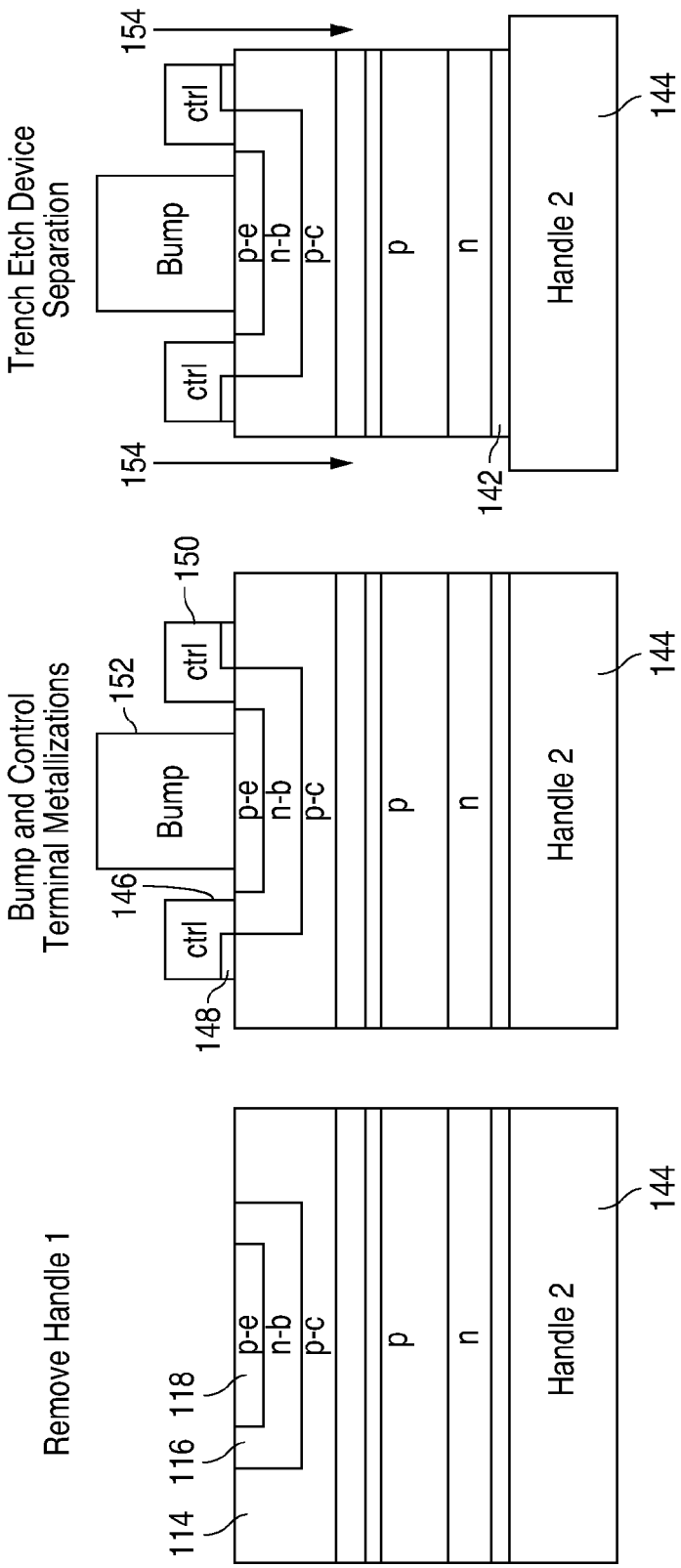

BONDING TRANSISTOR WAFER TO LED WAFER TO FORM ACTIVE LED MODULES

CROSS-REFERENCE TO RELATED APPLICATIONS

This is a continuation-in-part of U.S. application Ser. No. 13/737,672, filed on Jan. 9, 2013, by Bradley S. Oraw, and also claims priority to U.S. provisional application Ser. No. 61/789,106, filed on Mar. 15, 2013, by Bradley S. Oraw. Both applications are assigned to the present assignee and incorporated herein by reference.

FIELD OF THE INVENTION

This invention relates to light emitting diodes (LEDs) and, in particular, to a single die containing active circuitry in series with an LED to control current through the LED.

BACKGROUND

LEDs are typically formed as dies having an anode terminal and a cathode terminal. An LED die is typically mounted on a larger substrate for heat dissipation and packaging. The substrate may contain additional circuitry, such as a passive electrostatic discharge device. The LED die and optional substrate are then typically packaged, where the package has robust anode and cathode leads for being soldered to a printed circuit board (PCB).

LEDs may be controlled by a current source to achieve a desired brightness. The current source may be a MOSFET or a bipolar transistor formed in a separate die. The current source and LED are typically connected together by wires or a PCB.

Providing the current source separate from the LED die requires extra space and interconnections, adding cost. Other disadvantages exist, including the possibility of mismatching components. It would be desirable to provide a very compact LED module with an integrated current source driver circuit.

Additional problems arise when driving multi-colored LEDs, such as in a color display or for creating a white light source. An LED is a two terminal electrical device with non-linear voltage versus current characteristics. Below a particular voltage threshold, the LED is a high impedance. Above the threshold, the LED's impedance is much lower. This threshold depends primarily on the bandgap of the semiconductor LED. The bandgap is selected for a particular peak emission wavelength. Red LEDs have bandgaps on the order of 2 eV, blue LEDs have bandgaps on the order of 3 eV, and green LEDs have bandgaps between 2 eV-3 eV. Since the forward voltage is directly related to the bandgap energy, red, green, and blue LEDs cannot simply be connected in parallel to output a desired color or light; each color LED must have its own driver circuit. The different materials (e.g., GaAs, GaN, etc.) used to form the different color LEDs also affect the forward voltages. Further, even within LEDs outputting the same wavelength, their forward voltages vary due to process variations, so even connecting the same color LEDs in parallel is problematic. Providing a separate driver circuit for each LED and interconnecting it to the LED adds space and cost. This added size is particularly undesired when trying to minimize the size of an RGB pixel in a display.

LEDs can be organized in passive matrix addressable arrays. For instance, a set of LEDs can be connected with their cathodes connected to a row select driver and their anodes connected to a column data bus. Several of these rows can be used to form a larger array addressable by row and column. Providing a controlled current through an addressed row-column will energize the LED(s) at the addressed location(s) to emit the desired color and intensity of light, such as for a color pixel in a display. Since the interconnection between the LEDs is a non-zero impedance, the voltage drop throughout the interconnect network can inadvertently forward bias a non-addressed set of LEDs. Such incidental forward bias will cause excess light in non-addressed segments, which reduces light-to-dark contrast of the array.

It would be desirable to create integrated LED modules that avoid the above-mentioned problems when connected in an addressable array.

It would also be desirable to create integrated LED modules where LEDs of different colors can be connected in parallel to form a high density of compact RGB pixels.

It would also be desirable to create integrated LED modules of different colors that can be inexpensively packaged together in a single panel for generating light for backlighting, for general illumination, or for a color display.

It would also be desirable to create an interconnection and addressing scheme for multiple LED modules to form a compact light or display panel.

SUMMARY

Problems related to parallel and addressable connections of LEDs, such as in a color display, can be resolved by using active LED modules. In one embodiment, a single vertical LED module includes an LED in series with a vertical drive transistor (a voltage-to-current converter). Three terminals are provided on the module: a positive voltage terminal, a negative voltage terminal, and a control terminal for controlling the current through the LED. The difference between the voltages applied to the positive and negative voltage terminals must be sufficient to energize the LED to its full desired brightness when the control terminal is supplied a maximum value control signal.

The control terminal may be connected to the gate or source of a MOSFET connected in series with the LED. The control terminal is added so that the threshold non-linearity of the LED impedance is actively, rather than passively, controlled. For an LED module where voltage is provided across the power terminals of the module, the low impedance state (where the LED is emitting light) is determined by the control voltage applied to the control terminal. Such an active LED in a parallel or addressable network of LEDs would always be in a high impedance state until the control signal activates the low impedance state. This active impedance control reduces sensitivity to forward voltage and parasitic voltage drops and reverse current paths.

In one example, red, green, and blue LED modules are connected in parallel in an array for a multi-color display, where any set of RGB LEDs (forming a single pixel) is addressable by applying the same voltage across the voltage terminals of the three modules. The control terminal of each module is connected to a different variable control voltage to achieve the desired brightnesses of the red, green, and blue LEDs in the pixel. The control voltages are applied in sequence at 60 Hz or greater so that the different forward voltages of the RGB LEDs are no longer relevant.

In another embodiment, modules are connected in series and parallel for a white light source, where the white point is set by the relative combination of red, green, and blue light. The control voltage for each color and the duty cycle for each color are set to achieve the desired white point.

In other embodiments, various circuits are integrated with the LED to make the brightness of the LED less sensitive to variations in input voltage.

The modules may be formed by bonding an LED wafer to a driver transistor wafer, thereby connecting a terminal of each LED to a terminal of each driver transistor to form a series connection. The bonded wafers are then singulated to form thousands of modules at a time. The modules are extremely compact since the footprint may be approximately the same as a single conventional LED die (e.g., 0.25 mm$^2$-1 mm$^2$).

If the modules are printable, the footprint is much smaller. Printable modules may be formed with a top surface area range of between 50-5000 um$^2$. An array of small groups of the modules may be printed, where the modules in each group are connected in parallel to form a single color pixel having a desired maximum brightness. In one embodiment, the packaging for the module is also formed by printing.

The driver may be a bipolar transistor, a MOSFET, or other type transistor. In some embodiments, the current flow through the module is substantially completely vertical. In other embodiments, current flows vertically and laterally.

In a large lighting system using hundreds of medium power LEDs, it would be impractical to provide a conventional drive circuit for each of the LEDs. For such white light sources, many LEDs are typically connected in series, and a high voltage is connected across the string. In the prior art, providing such a high voltage sometimes requires a step up regulator, adding cost to the system. The present invention inherently provides each LED with its own driver, allowing many LEDs, even of different colors, to be connected in parallel so that they may be driven with a low voltage (e.g., 5 volts). Providing each LED with its own driver also enables each LED to be controlled to output a desired brightness despite process variations, changes in brightness with temperature, and changes in brightness with age.

Various module embodiments and fabrication methods are described along with various addressable arrays of LED modules that are suitable for LED displays or white light sources.

BRIEF DESCRIPTION OF DRAWINGS

FIG. 3 is a simplified cross-sectional view of a single singulated module.

FIG. 4 illustrates various ways to apply fixed voltages and variable control voltages to the three terminals of the module in FIG. 3, depending on the position of the LED and the type of driver transistor used.

FIG. 5 illustrates a singulated module die after packaging, such as in a panel.

FIGS. 18-35 are cross-sectional views illustrating various drive transistors and methods for forming various types of LED modules.

FIG. 18 illustrates a vertical pnp bipolar transistor used as the driver for the LED module.

FIG. 19 illustrates a vertical p-channel MOSFET used as the driver for the LED module.

FIG. 20 illustrates a trench-gate vertical p-channel MOSFET used as the driver for the LED module.

FIGS. 21-26 illustrate fabrication steps for forming the driver wafer of FIG. 18 or FIG. 19 and preparing it for bonding to the LED wafer.

FIGS. 27 and 28 illustrate fabrication steps for preparing the LED wafer for bonding to a driver wafer.

FIG. 29 illustrates bonding the driver wafer of FIG. 26 to the LED wafer of FIG. 28.

FIG. 30 illustrates the removal of the sapphire substrate from the LED wafer.

FIG. 31 illustrates a cathode metallization of the bottom of the LED wafer.

FIGS. 32-35 illustrate additional steps for forming the p-channel MOSFET driver of FIG. 19 and for forming a central raised source electrode for electrical contact by a conductor layer. The pnp bipolar transistor driver of FIG. 18 may be fabricated using a different metallization pattern.

Elements that are the same or similar in the figures are labeled with the same numeral.

DETAILED DESCRIPTION

Figure 1:
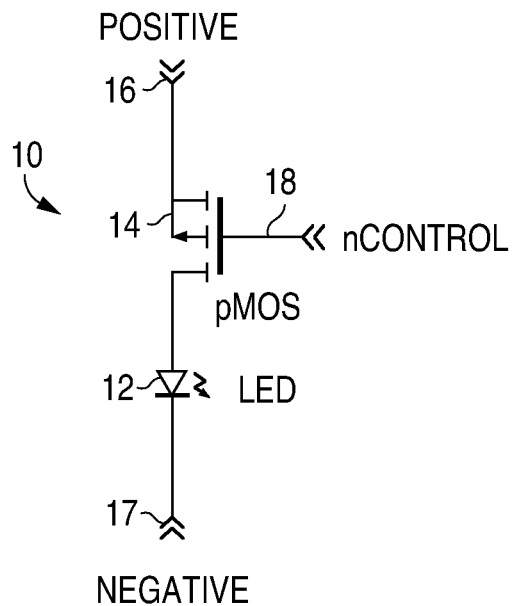
FIG. 1 is a schematic of a single LED module in accordance with one embodiment of the invention.

FIG. 1 illustrates one embodiment of the circuitry in a 3-terminal LED module 10. The module 10 is formed as a single die, singulated from a wafer. The module 10 contains an LED 12 and a PMOS driver transistor 14 with its source and drain in series with the LED 12 to control the current through the LED 12. The drain-source impedance adds to the impedance of the LED 12. Therefore, the total series impedance can be control by modulating the gate of the transistor 14. In this manner the transistor 14 performs a variable resistance or switching behavior. As such, forward current can only flow if the gate is biased beyond the PMOS transistor turn-on threshold. The module 10 may be packaged to have only three terminals 16, 17, and 18.

Other configurations of a single transistor, active LED are possible, as described later. The selection of a particular configuration of the LED and transistor and the particular type of transistor depends on the control requirements or constraints of the application.

Figure 2:
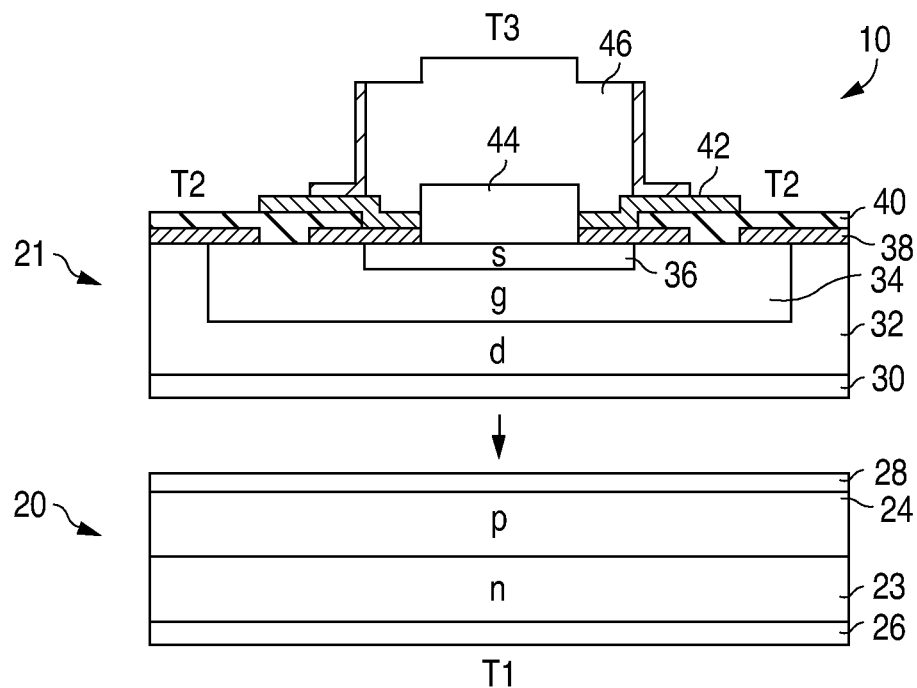
FIG. 2 is a cross-sectional view of a small portion of an LED wafer being bonded to a driver transistor wafer.

FIG. 2 illustrates one embodiment of the structure of the module 10. FIG. 2 illustrates small portions of two wafers 20 and 21, which may be formed using different materials and technologies.

Wafer 20 is an LED wafer containing thousands of vertical LEDs. For blue light, the material system may be AlInGaN, where the stoichiometry determines the peak emission wavelength. Forming such LEDs is well known. The blue LED may be eventually covered with a phosphor to produce any color. The LED wafer 20 may instead use other material systems to achieve a wide range of peak wavelengths from UV to red. The LEDs may include a multi-well active layer, as is well known. The wafer 20 is shown very simplistically since forming LEDs is conventional. Basically, an n-type epitaxial layer 23 and a p-type epitaxial layer 24 are grown over a growth substrate (e.g., sapphire, SiC, or GaAs). Light is generated at the pn interface. A multi-well active layer may be formed at the interface. The growth substrate should be removed if highly resistive or light absorbing. The n-type epitaxial layer 23 may also be thinned.

In one embodiment, the bottom surface of the LED wafer 20 is coated with a transparent conductor layer, such as a thin gold layer or another type of transparent conductor, to make ohmic contact to the layer 23 and spread current. Each LED portion has at least one metal electrode forming terminal T1. The metal electrodes may be formed as thin fingers, asterisk-shaped, or otherwise take up a small area so as not to block a significant amount of light in the downward direction. In another embodiment, the bottom surface of the LED wafer 20 is coated with a reflector layer so that light is only emitted from the sides or top of each singulated LED.

The bottom layer 26 in FIG. 2 represents any form of bottom conductor, including those described above. In the example, the bottom conductor is a cathode electrode, but in some embodiments, the bottom conductor is an anode electrode.

The top surface of the LED wafer 20 is prepared for being bonded to the bottom surface of the wafer 21 to form a substantially ohmic contact. The wafers 20 and 21 are aligned so that each transistor area in the wafer 21 is vertically aligned with each LED area in the wafer 20. In one embodiment, the top surface of wafer 20 is a very flat reflective metal layer 28 that is bonded to a similar metal layer 30 on wafer 21 by pressure and heat. In another embodiment, the joining surfaces of the wafers 20 and 21 may be by a proprietary process performed by Ziptronix, Inc., such as described in U.S. Pat. No. 7,842,540, incorporated herein by reference. The LED wafer 20 may have any diameter, such as 3-8 inches. A suitable voltage applied between the top and bottom surfaces of the LED wafer 20 will cause the LEDs to emit light.

The top wafer 21 forms an array of vertical p-channel transistors, where each transistor is associated with an LED area in the LED wafer 20. There will typically be thousands of LEDs and transistors formed in a wafer. The wafer 21 may use a p-type silicon substrate in which is formed, by conventional photolithographic techniques, a p-type drain well 32, an n-type gate 34, and a p-type source 36. The various regions may have a hexagonal shape or a square shape depending on the desired shapes of the modules after singulation.

The various dielectric layers and metal electrodes over the wafer 21 may be formed by printing or by using conventional photolithographic and vacuum chamber techniques. A dielectric layer 38 is formed with openings over the gate 34 and source 36. A first metal layer 40 is then deposited in the openings to contact the gate 34 and source 36. The first metal layer 40 may be an ink containing metal (e.g., Ni, Ti, Al, etc.) particles and a solvent. When the ink is cured, the solvent evaporates and the metal particles are sintered together. Another dielectric layer 42 is formed with openings over the source 36 metal and gate 34 metal. An additional metal layer 44, such as aluminum, is deposited over the source 36 metal, followed by a thick source electrode layer 46. The metal layers may include a barrier layer. The terminals T2 and T3 in FIG. 2 are designed for a particular type of packaging and array of modules, described later. The terminals T2 and T3 may be designed differently depending on the application and packaging.

The various dielectric and metal layers over the wafer 21 may be formed after the wafers 20 and 21 are ohmically bonded together to avoid damage to the conductors.

The bonded wafers 20 and 21 are then singulated using any of a variety of techniques such as etching, sawing, scribing-and-breaking, laser, etching trenches and dissolving a wafer bonding adhesive layer, etc. Printable LEDs may be formed with a top surface area range of between 50-5000 um². For very small LED sizes, etching is the preferred method for singulation.

FIG. 3 illustrates a simplified singulated LED module 10. In one embodiment, the size (footprint) of the module 10 is about 0.1 mm²-1 mm². The terminal T1 is shown taking up a small portion of the bottom surface of the module 10 to allow light to escape from the bottom surface.

To control the module 10 of FIG. 3 to emit light, assuming the configuration of FIG. 1, a positive voltage is applied to the source terminal T3, a negative voltage is applied to the cathode terminal T1, and a gate-source voltage (Vgs) exceeding the MOSFETs threshold is applied to the gate terminal T2. In one embodiment, to forward bias the LED, the voltage differential across terminals T3 and T1 is greater than 2 volts. For a blue LED 12, the required voltage differential may be greater than 4 volts.

FIG. 4 identifies various ways to control an LED module, depending on the position of the LED and the type of MOSFET used. For example, instead of controlling the MOSFET by controlling its gate voltage, the gate voltage may be fixed (e.g., positive, negative, or ground) and the source voltage may be controlled to achieve the desired Vgs. Other configurations of LEDs and current/voltage controlling transistors are shown in FIGS. 6-13, described later.

An advantage to using wafer bonding to bond the LED portion to the transistor portion is that different materials (e.g., Si and GaN) for the two wafers may be used. The growth substrate for either wafer may be removed if highly resistive or absorbs light.

FIG. 5 illustrates the module 10 packaged to encapsulate it and to provide conductors for applying power and control signals to the module 10. The encapsulated module 10 may form part of a display panel in which many modules are encapsulated in the same panel. In FIG. 5, a substrate 62 is provided, such as a transparent plastic or glass panel, with a conductor 64 for direct bonding to the terminal T1 of the LED module 10. The conductor 64 may be transparent or may be a metal that covers a small area of the back surface so as to block a minimum of light. In a panel, there may be many conductors 64 connected to various LED modules in an array, or a single conductor sheet may connect the LED modules in parallel. The conductor 64 is ultimately connected to a power terminal. Light from the LED may be emitted downward through the substrate 62. A dielectric layer 66 is then printed over the substrate 62 to encapsulate the sides of the module 10. The dielectric layer 66 may also encapsulate other modules supported by the substrate 62.

The module 10 may have a reflective film 68 formed on its sides prior to encapsulation to prevent side light emission, or the dielectric layer 66 may be reflective, such as white. The film 68 may also represent a dielectric coating if needed. Alternatively, side light from the LEDs is reflected upward and downward by the dielectric layer 66, such as where the dielectric layer 66 contains white titanium oxide particles. In such a case, the substrate 62 may be reflective so all light ultimately exits through the top surface of the panel.

A second conductor 70 is formed over the transistor and dielectric 66 to contact the gate terminal T2. A dielectric layer 72 is formed over the second conductor 70, and a third conductor 74 is formed over the dielectric layer 72 to contact the source terminal T3. In one embodiment, the conductors 64, 70, and 72 are narrow column and row lines of an addressable LED panel, such as a color display or a white light source.

In most cases, the dielectric layer 66 will be much thicker than the dielectric layer 72. The thin dielectric layer 72 is suitable for separating the conductors 70 and 74 if the conductors 70 and 74 conduct the positive and control voltages for a PMOS transistor, since leakage between these two conductors would not be a concern. Thus, the terminal T1 should be the negative voltage terminal. The selection of which of terminals T2 or T3 should be the positive voltage terminal and which should be the control terminal depends on the application. Typically the top conductor 74 will be lower resistivity than the middle conductor 70. As such, a good choice for terminal T3 would be the higher current positive voltage terminal.

The panel may include many thousands of LED modules 10 of various colors, such as the primary red, green, and blue, or other colors, such as yellow and white. All LEDs may be blue LEDs, with the red and green colors being formed by red and green phosphors. If the panel is a white light panel to be used for general illumination or as a backlight for an LCD, each LED may be a blue LED coated with a phosphor that adds green and red components to form white light. The panel may be on the order of 2 mm thick and be any size. The various LEDs may be connected in any configuration, such as series, parallel, or a combination to achieve the desired voltage drop and current.

Light may be emitted from the packaged module 10 in various ways. If the transistor wafer 21 (FIG. 2) is transparent to visible light, the conductors 70 and 74 are transparent or narrow, and the bonded interface between the wafers 20 and 21 is transparent, the LED light may be emitted through the top surface in the orientation of FIG. 5. A transparent wafer 21 may be SiC or GaN, and the transistor may be a well-known GaN HEMT, MOSFET, or MESFET. The bottom conductor 64 and the substrate 62 may be reflective.

Alternatively, the light may be emitted through the bottom of the package, where the conductor 64 is thin or transparent and the substrate 62 is transparent. The wafer bonding interface may be a reflective metal.

Alternatively, all LED light may be transmitted through the side walls of the LED, then reflected upward or downward through the top or bottom surface of the package. The wafer bonding interface may be a reflective metal. The dielectric layer 66 may be diffusively reflective to reflect the light upward and downward. The conductors 70 and 74 may be narrow or transparent if light is to be emitted through the top surface. The conductor 64 and substrate 62 may then be reflective. For bottom surface transmission, the conductors 70 and 74 may be reflective, the conductor 64 is narrow or transparent, and the substrate 62 is transparent.

In a module (such as the single die module of FIG. 3), the control transistor may be connected as a high side transistor or a low side transistor, and the transistor may be a MOSFET, a bipolar transistor, a JFET or any of the other types of transistors mentioned herein. All of the transistor types conduct current vertically. FIGS. 6-13 illustrate some of the possible configurations. Forming all of the vertical transistor types is well-known.

Figure 6:
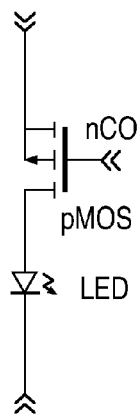
FIG. 6 illustrates a PMOS driver transistor connected to the anode of an LED.

FIG. 6 is identical to FIG. 1.

Figure 7:
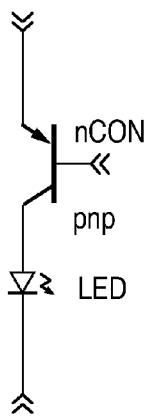
FIG. 7 illustrates a pnp bipolar driver transistor connected to the anode of an LED.

FIG. 7 uses a high side pnp bipolar transistor as the control transistor.

Figure 8:
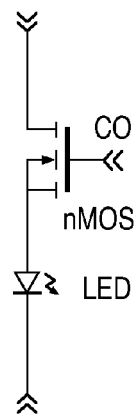
FIG. 8 illustrates an NMOS driver transistor connected to the anode of an LED.

FIG. 8 uses a high side n-channel MOSFET as the control transistor.

Figure 9:
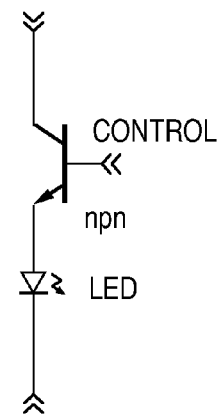
FIG. 9 illustrates an npn bipolar driver transistor connected to the anode of an LED.

FIG. 9 uses a high side npn bipolar transistor as the control transistor.

Figure 10:
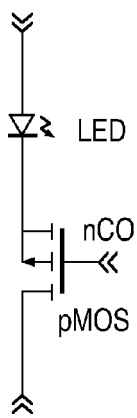
FIG. 10 illustrates a PMOS driver transistor connected to the cathode of an LED.

FIG. 10 uses a low side p-channel MOSFET as the control transistor.

Figure 11:
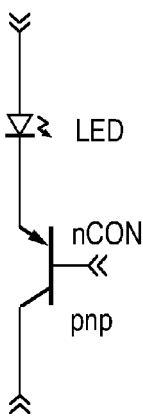
FIG. 11 illustrates a pnp bipolar driver transistor connected to the cathode of an LED.

FIG. 11 uses a low side pnp bipolar transistor as the control transistor.

Figure 12:
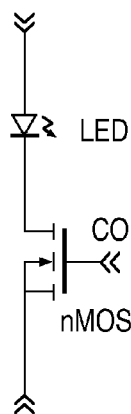
FIG. 12 illustrates an NMOS driver transistor connected to the cathode of an LED.

FIG. 12 uses a low side n-channel MOSFET as the control transistor.

Figure 13:
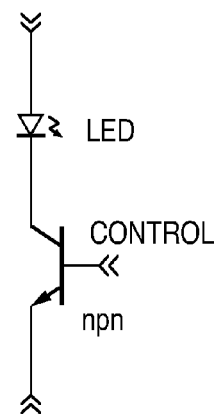
FIG. 13 illustrates an npn bipolar driver transistor connected to the cathode of an LED.

FIG. 13 uses a low side npn bipolar transistor as the control transistor.

The circuitry formed in the wafer 21 (FIG. 2) for each singulated LED module may include multiple transistors and other components, such as resistors, interconnected in any manner. Each LED module may also include multiple LEDs interconnected with the components formed in the wafer 21. The interface bonding the LED wafer and the "electronics" wafer may include an electrode pattern that creates multiple conductive paths between the LEDs and the components in the electronics wafer. For example, an electrode pattern formed on the top of the LED wafer may correspond to an electrode pattern formed on the bottom of the electronics wafer for creating a mechanical bond and for providing a certain electronic interconnection. An adhesive may also be used to additionally mechanically bond the wafers.

Figure 14:
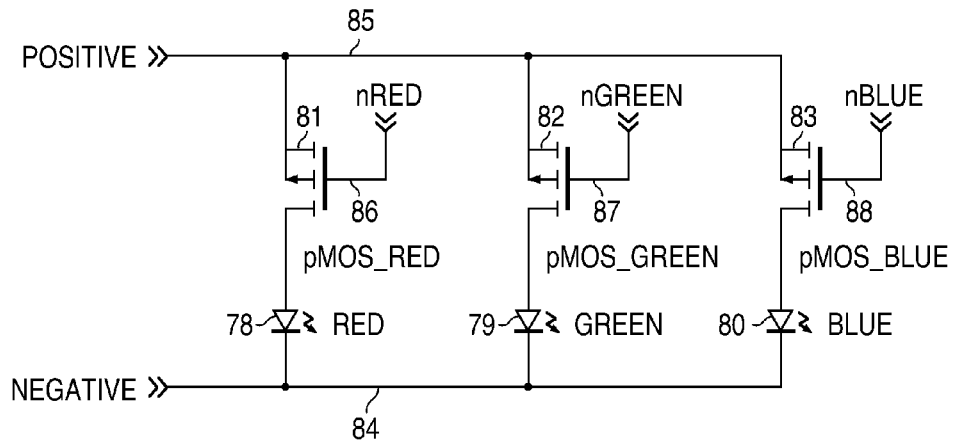
FIG. 14 illustrates RGB LED modules connected in parallel for a color display or for generating white light.

FIG. 14 illustrates circuitry in a single package containing at least three LED modules. The package may be a display panel containing an array of addressable LEDs. One module includes an LED 78 that emits red light, one module includes an LED 79 that emits green light, and one module includes an LED 80 that emits blue light. The LEDs 78 and 79 may be phosphor coated blue LEDs. The modules include p-channel MOSFETs 81, 82, and 83, similar to FIG. 1. The package includes conductors 85 (e.g., X-address lines) that electrically connect the sources together and conductors 84 (X-address lines) that connect the LED's cathodes together so that the modules are connected in parallel. Each LED is controlled by a separate control voltage applied to the gate of its respective MOSFET by conductors 86-88 (e.g., Y-address lines). In this way, any color light, including white, may be generated by the package. The three modules may form a single color pixel in a display or may be part of a white light panel.

The advantage of the integrated modules, when controlling different color LEDs connected in parallel, is that the modules can have two common terminals connected to the positive and negative voltages, with the third terminal selecting a single LED at a time. By only turning on one color LED at a time, its forward voltage does not affect the voltage across the other LEDs. For example, if the control voltages were all pulled low concurrently, the low forward voltage of the red LED 78 would prevent the green and blue LEDs from turning on. As long as only one LED color is active at a time, then there is no conflict between different forward voltages. The turn-on duration of the different LED colors can be divided in time (time division multiplexing), and the control voltage level can be adjusted for the active LED forward voltage. In one embodiment, the control voltages applied to the gates of the MOSFETs 86-88 are provided sequentially at a frequency above about 60 Hz, where the relative duty cycles of the control voltages control the perceived color of light.

Figure 15:
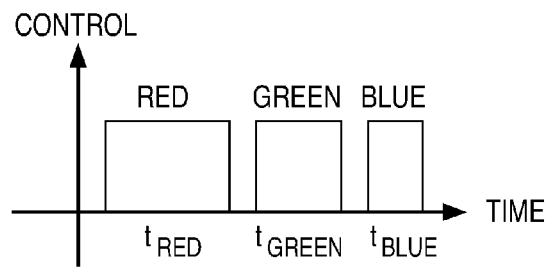
FIG. 15 illustrates how the RGB LEDs in FIG. 14 may be sequenced using the control voltage to create any color, including white light.

FIG. 15 is an example of the relative on-times of the red, green, and blue LEDs 78-80 in a single cycle for controlling the light emission from the three modules. The control voltages may be different for each color LED to cause the respective LED to emit a certain predetermined flux level (e.g., a nominal maximum brightness), whereby any overall brightness level and color, including white or neutral light, can be achieved by controlling the absolute on-times (for brightness) and the relative on-times (for color) per cycle.

Figure 16:
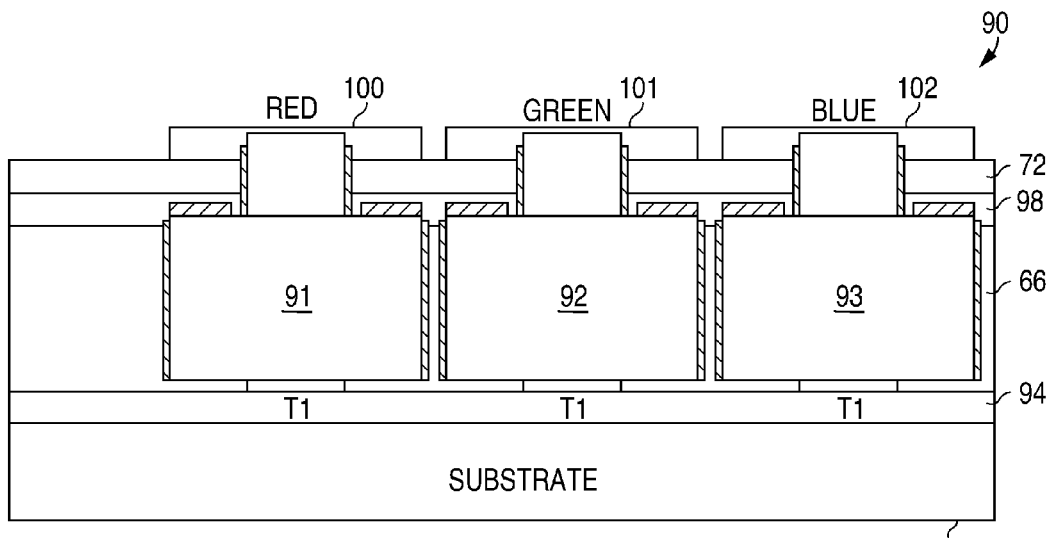
FIG. 16 illustrates separate RGB LED modules packaged together, such as in a color display.

FIG. 16 illustrates a package 90 containing three LED modules 91-93. The package may be an entire panel of addressable LEDs, and FIG. 16 may just illustrate a small portion of the panel. Module 91 contains a red LED, module 92 contains a green LED, and module 93 contains a blue LED. In the example of FIG. 16, the cathode terminals T1 of the LEDs are connected together by the conductor 94, supported by the substrate 96. The direction of light emission from the package 90 may be any of those directions discussed with respect to FIG. 5. The transistors in the modules 91-93 are p-channel MOSFETs, where a gate voltage sufficiently below the source voltage turns on the transistor and LED. The gates of the transistors are connected in common by the conductor 98, and the sources of the transistors are separately contacted by conductors 100-102, extending into and out of the drawing page. The voltage across the conductors 94 and 98 is higher than the forward voltage of any of the LEDs. By individually controlling the source voltages in a time-division fashion, the respective transistors can be separately controlled to conduct any current to control the mix of the RGB colors, such as to create white light or control a pixel color. The light from the RGB LEDs will be mixed only a few millimeters from the face of the panel and/or a diffuser panel may be used to improve the uniformity of light.

The dielectric layers 66 and 72 may be the same as in FIG. 5.

Alternatively, the sources of the transistors in FIG. 16 may be connected together by a conductor replacing conductors 100-102, and the gates are separately contacted by conductors replacing the common conductor 98 to allow individually controlling the transistors via the gate voltage.

In one embodiment, the structure of FIG. 16 represents a single 3-module package with five terminals. In another embodiment, the structure of FIG. 16 is only a portion of a much larger panel having a single substrate 96, where each color pixel location contains the three RGB modules. The dielectric 66 may be a single dielectric layer encapsulating all the modules on the panel. The pixels in a row may be addressed by applying a voltage across row (X) conductors 94 and 98, and the individual LEDs at any pixel location in an addressed row may be turned on by applying a suitable control voltage to the column (Y) conductors 100-102. Many modules in a column may receive the same control voltage, but LEDs in a non-addressed row will not turn on.

In high power (>0.1 W/in$^2$) lighting applications (including backlighting an LCD) where many LEDs can be on at the same time, it is advantageous for a given power to increase the operating voltage and reduce the current. Power losses in the printed interconnects are proportional to the square of the current; therefore efficiency can be increased by connecting multiple LED segments in series, which sum to a larger voltage but lower current. Therefore, to increase the operating voltage, modules can be coupled in combinations of series and parallel.

If the panel of FIG. 16 is to be used for general lighting, there is no need for row addressing, and the columns of series red, green, and blue LEDs are just addressed in a rapid time division repeating pattern by applying control voltages to the control terminals. To the human eye, the colors blend together without flicker. Either the on-time per color, the particular number of LEDs in a series, or the control voltage per color may be selected to generate the desired perceived color (e.g., white point). The emitted color may be controlled to be selectable by the user.

For a lighting panel (as opposed to a color display with addressable pixels), convergence of the individual RGB elements is important to reduce visual nuisances of unmixed color. Therefore it is desirable to pattern the individual LEDs colors in a regular pattern that will converge into the desired color within a particular diffusion length. Secondly, for warm white colors, considerably more red power is needed than green and blue. An RGB array having a regular pattern and twice as many red LEDs as green and blue LEDs may be used.

Within a single module, diodes, resistors, and transistors may be formed. The base or gate of the transistor may be internally connected to a resistor to form a voltage or current limiter, or other circuit. Therefore, the modules may only need two operating voltage terminals and no control terminal. This may be suitable for general lighting purposes or backlighting purposes. The drivers are generally characterized as a voltage-to-current (V-to-I) driver.

Figure 17:
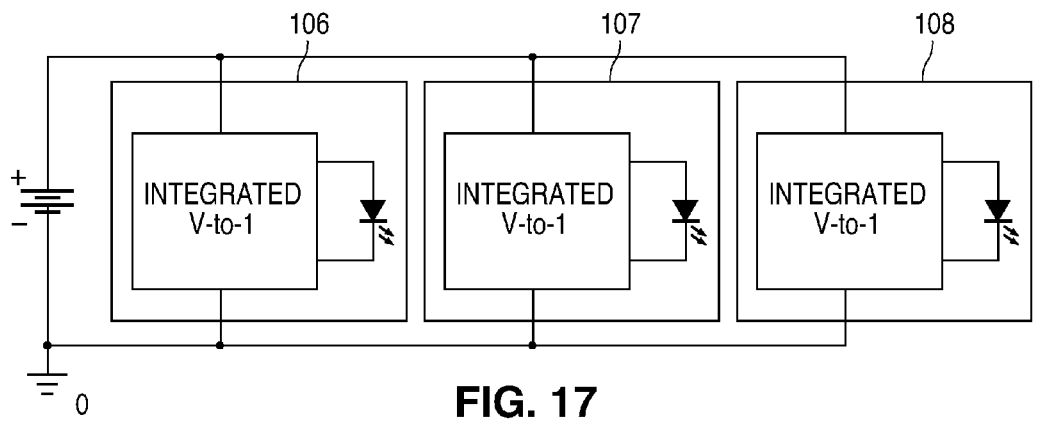
FIG. 17 illustrates how transistors and other circuitry may be integrated in the same substrate as the LED to form voltage clamps, current regulators, or other circuits. No external control voltage is required. This results in 2-terminal LED modules, such as RGB modules, where the modules are connected in parallel for a color pixel, including a white light pixel.

FIG. 17 illustrates 2-terminal modules 106-108 connected in parallel, where the three modules 106-108 contain red, green, and blue LEDs to form a single light element in a light panel, such as for general illumination or backlighting. The circuitry is set for each color LED to emit the desired brightness (by setting a certain current through the LED) while also setting the desired voltage drop across the module to allow each of RGB LEDs to turn on. The integrated LED modules can be paralleled to achieve uniform luminance without other external components. In another embodiment, all the LED are the same color, including blue LEDs with a phosphor coating to generate white light.

FIGS. 18-35 are cross-sectional views of portions of wafers illustrating methods for forming various types of LED modules. Only one device area of the wafer is shown for simplicity.

Figure 18:
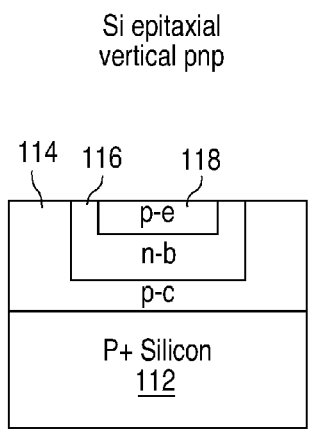

FIG. 18 illustrates a vertical pnp bipolar transistor used as the driver for the LED module. A p+ type silicon growth substrate 112 is used for the driver wafer. A p-type collector 114 is formed over the substrate 112, followed by forming the n-type base 116 and p+ type emitter 118.

Figure 19:
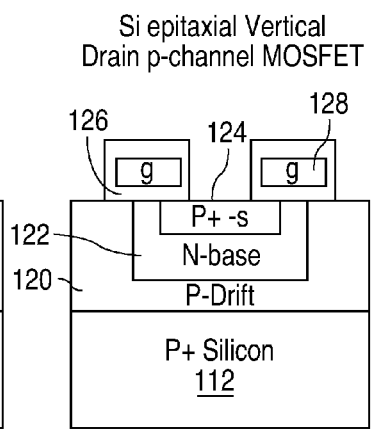

FIG. 19 illustrates a vertical p-channel MOSFET used as the driver for the LED module. Over the p+ type substrate 112 is formed a p-type drift region 120, followed by forming the n-type body 122 and p+ type source 124. Gate dielectric 126 is thermally grown over the channel region followed by forming the conductive gates 128. The source 124 is shorted to the body 122 by a metal source electrode outside the plane of the cross-section.

Figure 20:
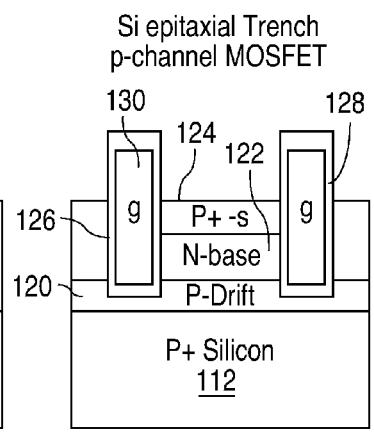

FIG. 20 illustrates a trench-gate vertical p-channel MOSFET used as the driver for the LED module. The regions 120, 122, and 124 may be similar to those in FIG. 19. Trenches 126 are etched down into the p-type drift region/layer 120, and the walls of the trenches 126 are coated with a thin dielectric layer 128. Conductive gate material then fills the trenches to form trenched gates 130.

In FIGS. 18-20, the top surface features, such as the emitter-base and the source-gate, are contacted by a patterned metal layer to form the module terminals T2 and T3 in FIG. 3.

FIGS. 21-26 illustrate fabrication steps for forming the driver wafer of FIG. 18 or FIG. 19 and preparing it for bonding to the LED wafer.

Figure 21:
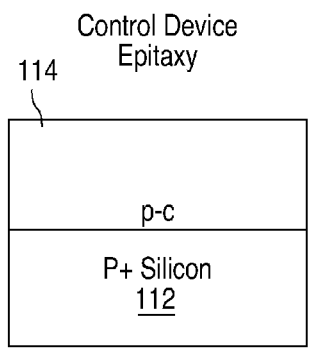

In FIG. 21, the p+ type silicon substrate 112 has formed over it the p-type collector 114 by epitaxial growth during in-situ doping or by implantation.

Figure 22:
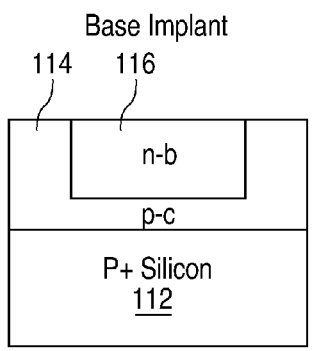

In FIG. 22, the top surface is masked and the n-type base (or body) 116 is formed by implantation of n-type dopants.

Figure 23:
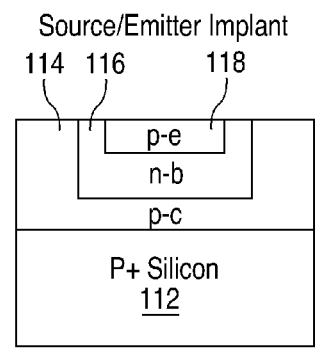

In FIG. 23, the top surface is masked and the p+ type emitter (or source) 118 is formed by implantation of p-type dopants.

In FIG. 24, a handle1 (or carrier) wafer 130 is affixed to the top of the driver transistor wafer under pressure using a releasable adhesive. The adhesive layer is cured by a method appropriate for the particular adhesive layer used.

In FIG. 25, the handle1 wafer 130 is used for mechanical support while the substrate 112 is removed, such as by grinding or chemical-mechanical polishing (CMP). This reduces the vertical resistance of the driver transistor.

In FIG. 26, the bottom surface of the transistor is metallized to form a low-resistance, smooth contact 132, such as Ti or Au.

In FIGS. 27 and 28, the LED wafer is prepared. For GaN-based LEDs, emitting blue light, the growth substratre 134 used in the example is sapphire, although SiC, GaN, or silicon may be used. Various intermediate layers may be used to lattice-match the substrate 134 with the LED GaN layers. A GaN-based n-type layer 136 (e.g., AlInGaN) is epitaxially grown, followed by growing an active layer (not shown), followed by growing a GaN-based p-type layer 138. The top surface is metallized to form a reflective anode electrode 140, such as Ti or Au, that is very smooth and can bond with the smooth contact 132 (FIG. 26) on the driver transistor wafer. The electrode 140 may comprise a plurality of metal layers, such as a silver reflective layer, for purposes of conduction and reflection, and an Au or Ti layer for the bonding layer. The electrodes may be polished for a good ohmic connection.

FIG. 29 illustrates bonding the driver wafer of FIG. 26 to the LED wafer of FIG. 28. The Ti—Ti or Au—Au bonding may be made under heat and pressure.

FIG. 30 illustrates the removal of the sapphire substrate 134 from the LED wafer while using the handle1 wafer 130 for mechanical support. The substrate 134 may be removed by grinding or laser lift-off.

FIG. 31 illustrates the metallization of the wafer to form the LED's cathode electrode 142. The metal may form thin fingers to spread current but allow light to escape from the bottom of the LED. Alternatively, the cathode electrode may comprise a transparent conductor with a small metal electrode either in the center or around the periphery.

FIG. 32 illustrates a handle2 wafer 144 adhesively bonded to the cathode electrode 142 via a releasable adhesive.

FIG. 33 illustrates the handle1 wafer 130 removed by dissolving the adhesive bond in a solution or by other means (e.g., heat) depending on the type of adhesive used.

The transistor regions of FIG. 33 can be either those of a pnp bipolar transistor (FIG. 18) or a p-channel MOSFET. The steps shown in FIG. 34 result in the transistor being a p-channel MOSFET. A gate dielectric 146 is grown and patterned so as to overlie the channel region. A thicker dielectric 148 is deposited and patterned to expose the gate dielectric 146. A conductive gate 150 (metal or polysilicon) is formed at least over the channel region to invert the channel and turn on the transistor with a sufficient gate-source voltage. If a pnp bipolar transistor were formed, the transistor would be turned on with a base-emitter voltage above about 0.6 volts.

A tall source electrode 152 is formed to enable the source electrodes 152 to be contacted by a conductor layer, such as the conductor 102 in FIG. 16. A dielectric passivation layer, such as Si3N4 or SiO2, may be formed over the exposed semiconductor surface.

The transistor may be substantially symmetrical about the source electrode 152, such as forming a hexagonal shape, where the gate 150 is continuous and surrounds the source electrode 152. The top-down shape of the transistor may instead be square.

In FIG. 35, trenches 154 are patterned, using photolithography, and etched through the various layers to expose the adhesive layer bonding the cathode electrode 142 to the handle2 wafer 144. The trenches 154 define the top-down shapes of the modules.

The exposed adhesive layer is then dissolved in a solution to release the singulated modules from the handle2 wafer. A sticky, stretchable film may be adhered to the top surfaces of the wafer prior to singulation in order to maintain the relative positions of the modules for a pick-and-place process when packaging the modules.

The proposed solutions described herein integrate the V-to-I driver with the LED in a single die. The driver and LED form an integrated circuit die, which is fabricated on two wafers that are bonded together, then singulated. This integration reduces intrinsic and parasitic uncertainty of the LED and the interconnection to the global system. The integration also greatly reduces the size and cost of the circuit compared to using non-integrated V-to-I drivers. This allows each LED to have its own dedicated driver.

Additionally, providing each LED with its own controllable driver enables each LED to be controlled to output a desired brightness despite process variations, changes in brightness with temperature, and changes in brightness with age.

Some preceding examples have used MOSFETs and bipolar transistors; however, the scope of this invention is not limited by the transistor technology. Realizations can be created using a CMOS, BiCMOS, BCD, or other integrated circuit processes. Additional transistor technologies not shown could be used as well such as JFET, IGBT, Thyristor (SCR), Triac, and others.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An integrated driver and light emitting diode (LED module) comprising:
    a vertical light emitting diode (LED) having a top LED conducting surface and a bottom LED conducting surface, the LED comprising at least an n-type epitaxial layer and a p-type epitaxial layer; and
    a vertical transistor in series with the LED, the transistor and the LED having been formed separately and independently prior to being connected in series, the vertical transistor comprising at least an n-type silicon area and a p-type silicon area,
    the transistor having a first terminal, a second terminal, and a third terminal, the first terminal being a bottom conducting surface of the transistor, the bottom conducting surface of the transistor being electrically and mechanically bonded to the top LED conducting surface,
    the LED and transistor being substantially the same size,
    the LED being configured to emit light when a first voltage is applied to the bottom LED conducting surface, a second voltage is applied to the second terminal, and a first control voltage is applied to the third terminal.

2. The module of claim 1 wherein the transistor has a top surface, wherein the second terminal and third terminal are formed on the top surface.

3. The module of claim 1 wherein the transistor is a FET.

4. The module of claim 3 wherein the first terminal is a drain terminal, the second terminal is a gate terminal, and the third terminal is a source terminal.

5. The module of claim 3 wherein the first terminal is a drain terminal, the second terminal is a source terminal, and the third terminal is a gate terminal.

6. The module of claim 1 wherein the transistor is a bipolar transistor.

7. The module of claim 1 wherein the top LED conducting surface is an anode and the bottom LED conducting surface is a cathode.

8. The module of claim 1 wherein the top LED conducting surface is a cathode and the bottom LED conducting surface is an anode.

9. The module of claim 1 wherein the LED is GaN-based and the transistor is silicon-based.

10. A method of forming a lighting device comprising:
forming a first array of vertical light emitting diodes (LEDs) in an LED wafer, each of the LEDs having a top LED conducting surface and a bottom LED conducting surface; and
forming a second array of vertical transistors in a transistor wafer, each of the transistors having a first terminal, a second terminal, and a third terminal, the first terminal being a bottom conducting surface of the transistors;
aligning the LED wafer with the transistor wafer such that each transistor area in the transistor wafer is aligned with each LED area in the LED wafer;
forming bonded wafers by bonding the top LED conducting surface of the LED wafer to the bottom conducting surface of the transistor wafer to electrically and mechanically bond the top LED conducting surface to the bottom conducting surface by a bonding layer; and
singulating the bonded wafers to create individual modules, each module containing at least a driver transistor and an LED.

11. The method of claim 10 wherein forming the first array of vertical LEDs comprises epitaxially growing LED layers over an LED growth substrate, the method further comprising removing the growth substrate after bonding the top LED conducting surface of the LED wafer to the bottom conducting surface of the transistor wafer.

12. The method of claim 10 wherein forming the second array of vertical transistors comprises forming transistor regions over a substrate, the method further comprising removing the substrate prior to bonding the top LED conducting surface of the LED wafer to the bottom conducing surface of the transistor wafer.

13. The method of claim 12 further comprising affixing a first carrier wafer to a top surface of the transistor wafer prior to removing the substrate.

14. The method of claim 13 further comprising affixing a second carrier wafer to the bottom LED conducting surface, and then removing the first carrier wafer to process a top surface of the transistor wafer.

15. The method of claim 14 further comprising etching trenches in the LED wafer and transistor wafer down to the second carrier wafer to define the individual modules, then removing the individual modules from the second carrier wafer.

16. The method of claim 14 further comprising packaging the individual modules to form an array of modules for generating light.

17. The method of claim 16 wherein the array of modules is part of an addressable color display.

18. The method of claim 16 wherein the array of modules is part of a light source generating white light.

* * * * *